United States Patent
Seol et al.

(10) Patent No.: US 9,905,627 B2
(45) Date of Patent: Feb. 27, 2018

(54) THIN FILM TRANSISTOR SUBSTRATE AND ORGANIC LIGHT-EMITTING DIODE DISPLAY INCLUDING THE SAME

(71) Applicants: Samsung Display Co., Ltd., Yongin-si, Gyeonggi-do (KR); UNIVERSITY-INDUSTRY COOPERATION GROUP OF KYUNG HEE UNIVERSITY, Yongin-si, Gyeonggi-do (KR)

(72) Inventors: Younggug Seol, Yongin-si (KR); Taewoong Kim, Yongin-si (KR); Jaegwang Um, Yongin-si (KR); Sunhee Lee, Yongin-si (KR); Jin Jang, Yongin-si (KR)

(73) Assignees: Samsung Display Co., Ltd., Gyeonggi-do (KR); University-Industry Coorperation Group of Kyung Hee University, Gyeonggi-do (KR)

( * ) Notice: Subject to any disclaimer, the term of this patent is extended or adjusted under 35 U.S.C. 154(b) by 8 days.

(21) Appl. No.: 15/051,544

(22) Filed: Feb. 23, 2016

(65) Prior Publication Data
US 2016/0365404 A1    Dec. 15, 2016

(30) Foreign Application Priority Data

Jun. 11, 2015    (KR) .................... 10-2015-0082567

(51) Int. Cl.
*H01L 27/32*    (2006.01)
*H01L 27/12*    (2006.01)
*H01L 29/786*    (2006.01)

(52) U.S. Cl.
CPC ........ *H01L 27/3276* (2013.01); *H01L 27/124* (2013.01); *H01L 27/1225* (2013.01); *H01L 27/3262* (2013.01); *H01L 29/7869* (2013.01)

(58) Field of Classification Search
CPC .............. H01L 27/124; H01L 27/1225; H01L 29/7869; H01L 27/3276; H01L 27/3262
See application file for complete search history.

(56) References Cited

U.S. PATENT DOCUMENTS

2013/0207101 A1    8/2013    Yamazaki et al.
2015/0034945 A1*   2/2015    Sakakura ............ H01L 29/7869
                                                          257/43

(Continued)

FOREIGN PATENT DOCUMENTS

JP    2006-286772 A    10/2006
JP    2013-179295 A    9/2013
KR    10-2014-0021790 A    2/2014

OTHER PUBLICATIONS

Mativenga et al., "Corbino TFTs for Large-Area AMOLED Displays", SID Digest (2014): pp. 705-708.*

(Continued)

*Primary Examiner* — Michele Fan
(74) *Attorney, Agent, or Firm* — Knobbe, Martens, Olson & Bear, LLP

(57) ABSTRACT

A thin film transistor substrate and an organic light-emitting diode display including the same are disclosed. In one aspect, the TFT substrate includes substrate and a TFT located on the substrate. The TFT includes a lower gate electrode, a first insulating layer covering the lower gate electrode, an oxide semiconductor layer located on the first insulating layer, a first electrode located on the oxide semiconductor layer and having an island shape, a second electrode located on the oxide semiconductor layer and surrounding the first electrode, a second insulating layer at (Continued)

least partially covering the oxide semiconductor layer; and an upper gate electrode located on the second insulating layer. The oxide semiconductor layer includes a first region, a second region surrounding the first region, and a third region interposed between the first and second regions.

17 Claims, 16 Drawing Sheets

(56) References Cited

U.S. PATENT DOCUMENTS

2015/0054722 A1* 2/2015 Kanda .................. G09G 3/3233
                                                                                         345/77
2015/0372146 A1* 12/2015 Shishido ............. H01L 29/7869
                                                                                         257/43

OTHER PUBLICATIONS

Baek et al., "P-11: Electrical Properties and Stability of Dual-Gate Coplanar Homojunction Amorphous Indium-Gallium-Zinc-Oxide Thin-Film Transistor," *SID 11 Digest*, ISSN 0097-966x/11/4203-1136, © 2011 SID, pp. 1136-1139.

* cited by examiner

THIN FILM TRANSISTOR SUBSTRATE AND ORGANIC LIGHT-EMITTING DIODE DISPLAY INCLUDING THE SAME

INCORPORATION BY REFERENCE TO ANY PRIORITY APPLICATIONS

This application claims the benefit of Korean Patent Application No. 10-2015-0082567, filed on Jun. 11, 2015, in the Korean Intellectual Property Office, the disclosure of which is incorporated herein in its entirety by reference.

BACKGROUND

Field

The described technology generally relates to a thin film transistor substrate and an organic light-emitting diode display including the same.

Description of the Related Technology

There is a demand for display devices to be thin and lightweight. As the demand for display devices having high resolution and a wide display area has increased, there is also a need for high-quality thin film transistors that are small and not influenced by unintended voltage drops.

SUMMARY OF CERTAIN INVENTIVE ASPECTS

One inventive aspect relates to a thin film transistor substrate and an organic light-emitting diode (OLED) display including the same.

Another aspect is a thin film transistor substrate that includes a substrate; and a thin film transistor located on the substrate, wherein the thin film transistor includes: a lower gate electrode; a first insulating layer covering the lower gate electrode; an oxide semiconductor layer located on the first insulating layer; an inner electrode located on the oxide semiconductor layer and in an island shape; an outer electrode located on the oxide semiconductor layer and surrounding the inner electrode; a second insulating layer covering the oxide semiconductor layer; and an upper gate electrode located on the second insulating layer, wherein the oxide semiconductor layer includes a center region and an outer region surrounding the center region and an intermediate region between the center region and the outer region, wherein the inner electrode is located on the center region of the oxide semiconductor layer, wherein the outer electrode is located on the outer region of the oxide semiconductor layer, and wherein the lower gate electrode and the upper gate electrode are disposed to face each other with the intermediate region of the oxide semiconductor layer disposed between the lower gate electrode and the upper gate electrode.

The inner electrode may include a source electrode, and the outer electrode may include a drain electrode.

The lower gate electrode may include a first opening corresponding to the inner electrode, and the upper gate electrode may include a second opening corresponding to the first opening.

A size of the inner electrode may be greater than a size of the first opening and smaller than a size of the second opening.

The lower gate electrode may have a first width from an inner end portion adjacent to the first opening to an outer end portion of the lower gate electrode, and the upper gate electrode may have a second width from an inner end portion adjacent to the second opening to an outer end portion of the upper gate electrode.

The first width may be greater than the second width.

The first width may be greater than a width of an intermediate region of the oxide semiconductor layer, and at least one of the inner end portion and the outer end portion of the lower gate electrode may partially overlap the inner electrode or the outer electrode.

The second width may be less than a width of the intermediate region of the oxide semiconductor layer, wherein the inner end portion of the upper gate electrode is spaced apart from the outer end portion of the inner electrode in a direction toward the outer electrode from the inner electrode, and wherein the outer end portion of the upper gate electrode is spaced apart from the inner end portion of the outer electrode in a direction toward the inner electrode from the outer electrode.

The inner electrode and the outer electrode may be located on the same layer.

The lower gate electrode and the upper gate electrode may have the same voltage level.

The thin film transistor substrate may further include: a connection wiring located on the second insulating layer and electrically connected to the inner electrode.

Another aspect is an OLED display that includes a plurality of pixels arranged on a substrate, wherein each of the plurality of pixels includes: a switching thin film transistor located on the substrate; a driving thin film transistor located on the substrate and electrically connected to the switching thin film transistor; a pixel electrode connected to the driving thin film transistor; an emissive layer located on the pixel electrode; and a counter electrode facing the pixel electrode with the emissive layer disposed between the counter electrode and the pixel electrode, wherein the driving thin film transistor includes: an oxide semiconductor layer; an inner electrode located on a center region of the oxide semiconductor layer in an island shape; an outer electrode located on an outer region of the oxide semiconductor layer, wherein the outer region is spaced apart from the center region and surrounds the center region; and lower and upper gate electrodes disposed to face each other with the oxide semiconductor layer disposed between the lower and upper gate electrodes.

The inner electrode may include a source electrode, and the outer electrode may include a drain electrode.

The lower gate electrode may include a first opening corresponding to the inner electrode, and the upper gate electrode may include a second opening corresponding to the first opening.

The first opening, the second opening, and the inner electrode may be disposed on the same axial line.

An inner end portion of the lower gate electrode adjacent to the first opening may partially overlap the inner electrode.

A size of the second opening of the upper gate electrode may be greater than a size of the inner electrode.

The inner electrode and the outer electrode may be located on the same layer.

The lower gate electrode and the upper gate electrode may have the same voltage level.

The upper and lower gate electrodes of the driving thin film transistor may control a grayscale of each of the plurality of pixels including the driving thin film transistor.

Another aspect is a thin film transistor (TFT) substrate, comprising: a substrate and a TFT located on the substrate. The TFT comprising: a lower gate electrode; a first insulating layer covering the lower gate electrode; an oxide semiconductor layer located on the first insulating layer; a first electrode located on the oxide semiconductor layer and having an island shape; a second electrode located on the oxide semiconductor layer and surrounding the first electrode; a second insulating layer at least partially covering the oxide semiconductor layer; and an upper gate electrode located on the second insulating layer. The oxide semiconductor layer includes a first region, a second region surrounding the first region, and a third region interposed between the first and second regions, wherein the first electrode is located in the first region of the oxide semiconductor layer, wherein the second electrode is located in the second region of the oxide semiconductor layer, wherein the lower and upper gate electrodes face each other, and wherein the third region of the oxide semiconductor layer is interposed between the lower and upper gate electrodes.

In the above TFT substrate, the first electrode includes a source electrode, wherein the second electrode includes a drain electrode.

In the above TFT substrate, the lower gate electrode has a first opening corresponding to the first electrode, wherein the upper gate electrode has a second opening corresponding to the first opening.

In the above TFT substrate, the first electrode is larger than the first opening and smaller than the second opening.

In the above TFT substrate, the lower gate electrode has a first width defined from an inner end portion, adjacent to the first opening, to an outer end portion of the lower gate electrode, wherein the upper gate electrode has a second width defined from an inner end portion, adjacent to the second opening, to an outer end portion of the upper gate electrode.

In the above TFT substrate, the first width is greater than the second width.

In the above TFT substrate, the first width is greater than a width of the third region of the oxide semiconductor layer, wherein at least one of the inner and outer end portions of the lower gate electrode partially overlaps the first electrode or the second electrode.

In the above TFT substrate, the second width is less than a width of the third region of the oxide semiconductor layer, wherein the inner end portion of the upper gate electrode is spaced apart from the outer end portion of the first electrode in a direction extending from the first electrode toward the second electrode, and wherein the outer end portion of the upper gate electrode is spaced apart from the inner end portion of the second electrode in a direction extending from the second electrode toward the first electrode.

In the above TFT substrate, the first and second electrodes are located on the same layer.

In the above TFT substrate, the lower and upper gate electrodes are configured to have the same voltage level.

The above TFT substrate further comprises a connection wiring located on the second insulating layer and electrically connected to the first electrode.

Another aspect is an organic light-emitting diode (OLED) display, comprising: a plurality of pixels disposed on a substrate. Each of the pixels comprises: a switching thin film transistor (TFT) located on the substrate; a driving TFT located on the substrate and electrically connected to the switching TFT; a pixel electrode electrically connected to the driving TFT; an emissive layer located on the pixel electrode; and a counter electrode facing the pixel electrode with the emissive layer interposed between the counter electrode and the pixel electrode. The driving TFT comprises: an oxide semiconductor layer; a first electrode located on a first region of the oxide semiconductor layer and having an island shape; a second electrode located on an second region of the oxide semiconductor layer, wherein the second region is spaced apart from the first region and surrounds the first region; and lower and upper gate electrodes facing each other with the oxide semiconductor layer disposed between the lower and upper gate electrodes.

In the above OLED display, the first electrode includes a source electrode, wherein the second electrode includes a drain electrode.

In the above OLED display, the lower gate electrode has a first opening corresponding to the first electrode, wherein the upper gate electrode has a second opening corresponding to the first opening.

In the above OLED display, the first opening, the second opening, and the first electrode are disposed on the same axial line.

In the above OLED display, an inner end portion of the lower gate electrode adjacent to the first opening partially overlaps the first electrode.

In the above OLED display, the second opening of the upper gate electrode is larger than the first electrode.

In the above OLED display, the first and second electrodes are located on the same layer.

In the above OLED display, the lower and upper gate electrodes are configured to have the same voltage level.

In the above OLED display, the upper and lower gate electrodes of the driving TFT are configured to control a grayscale of a selected pixel including the driving TFT.

DETAILED DESCRIPTION OF CERTAIN ILLUSTRATIVE EMBODIMENTS

Figure 1:
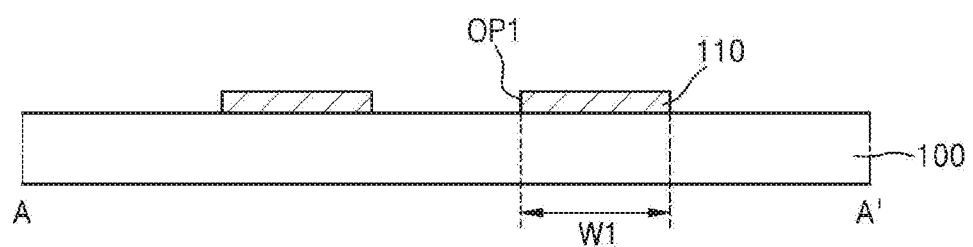
FIGS. 1, 3, 5, and 7 are cross-sectional views illustrating stages in an embodiment of a manufacturing method of a thin film transistor substrate.

Since the described technology may have various modifications and several embodiments, exemplary embodiments are shown in the drawings and will be described in detail. Advantages, features, and a method of achieving the same will be specified with reference to the exemplary embodiments described below in detail together with the attached drawings. However, the exemplary embodiments may have different forms and should not be construed as being limited to the descriptions set forth herein.

Exemplary embodiments of the described technology will be described below in more detail with reference to the accompanying drawings. Those components that are the same or are in correspondence are rendered the same reference numeral in the drawings, and redundant explanations are omitted.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

In the exemplary embodiments below, it will be further understood that the terms "comprise" and/or "have" used herein specify the presence of stated features or components, but do not preclude the presence or addition of one or more other features or components.

In the exemplary embodiments below, it will be understood when a portion such as a layer, an area, or an element is referred to as being "on" or "above" another portion, it can be directly on or above the other portion, or intervening portion may also be present.

Also, in the drawings, for convenience of description, sizes of elements may be exaggerated or contracted. In other words, since sizes and thicknesses of components in the drawings are arbitrarily illustrated for convenience of explanation, the following embodiments are not limited thereto.

When an exemplary embodiment is implementable in another manner, a predetermined process order may be different from a described one. For example, two processes that are consecutively described may be substantially simultaneously performed or may be performed in an opposite order to the described order.

It will be understood when a portion such as a layer, an area, or an element is referred to as being connected, it can be connected directly, or intervening portion may also be present. For example, it will be understood that when a portion such as a layer, an area, or an element is referred to as being electrically connected, it can be electrically connected directly, or intervening portion may also be present. As used herein, the term "and/or" includes any and all combinations of one or more of the associated listed items. Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art. The term "connected" can include an electrical connection.

FIGS. 1, 3, 5, and 7 are cross-sectional views illustrating stages in an embodiment of a manufacturing method of a thin film transistor substrate. FIGS. 2, 4, 6, and 8 are plan views illustrating each stages in an embodiment of a manufacturing method of a thin film transistor substrate. FIGS. 1, 3, 5, and 7 respectively correspond to cross-sectional views taken along lines A-A' of FIGS. 2, 4, 6, and 8.

Figure 2:
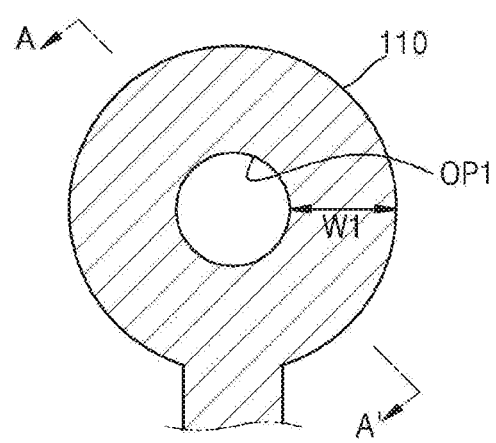
FIGS. 2, 4, 6, and 8 are plan views illustrating stages in an embodiment of a manufacturing method of a thin film transistor substrate.

Referring to FIGS. 1 and 2, a lower gate electrode 110 formed on a substrate 100.

The substrate 100 may be formed of a glass material, a metal material, or a plastic material such as polyethylene terephthalate (PET), polyethylene naphthalate (PEN), polyimide, etc. A buffer layer (not shown) having an insulating property such as silicon oxide and a silicon nitride may be formed on the substrate 100 before forming the lower gate electrode 110 on the substrate 100.

The lower gate electrode 110 may be formed on the substrate 100 by forming a metal layer (not shown) and patterning the metal layer. The lower gate electrode 110 may include a first opening OP1 in a center region thereof and may have a first width W1 from an inner end portion adjacent to the first opening OP1 to an outer end portion. At least a part of the lower gate electrode 110 may approximately have a ring shape. The first opening OP1 of the lower gate electrode 110 may overlap an inner electrode 130 formed during a process that will be described later, thereby preventing generation of parasitic capacitance between the inner electrode 130 and the lower gate electrode 110.

The lower gate electrode 110 may be formed to have a single or multi-layer structure by using one or more materials among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or an alloy thereof, by taking into account an adhesive force with respect to an adjacent layer, a degree of surface planarization of a layer to be stacked, and process ability.

Figure 3:
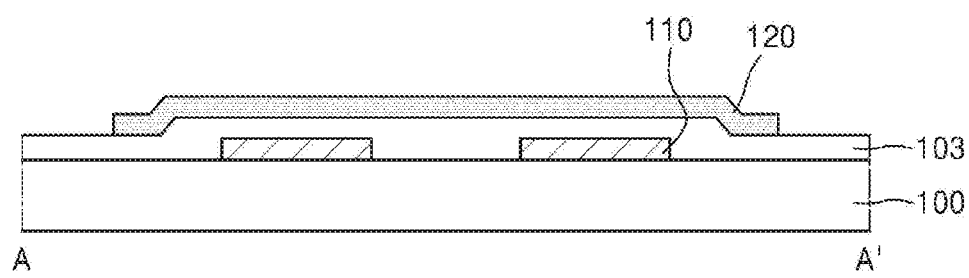
Figure 4:
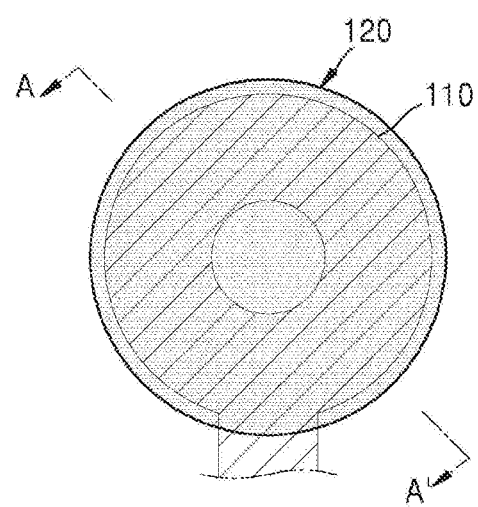

Referring to FIGS. 3 and 4, an oxide semiconductor layer 120 is formed after forming a first insulating layer 103 on the lower gate electrode 110.

The first insulating layer 103 may be formed to completely cover the substrate 100 and may include an insulating inorganic material such as silicon oxide and silicon nitride or an insulating organic material.

The oxide semiconductor layer 120 may be located on the first insulating layer 103 and may be patterned such that a part of the oxide semiconductor layer has an island shape and overlaps the lower gate electrode 110. The size of the oxide semiconductor layer 120 may be greater than that of the lower gate electrode 110 so that the oxide semiconductor layer 120 may completely cover the lower gate electrode 110. For example, a diameter of the oxide semiconductor layer 120 is greater than the diameter of the lower gate electrode 110, i.e. the diameter of an outer end portion of the lower gate electrode 110, so that the oxide semiconductor layer 120 may completely cover the lower gate electrode 110.

The oxide semiconductor layer 120 may be formed of one or more elements of indium (In), gallium (Ga), stannum (Sn), zirconium (Zr), vanadium (V), hafnium (Hf), cadmium (Cd), germanium (Ge), and zinc (Zn). For example, the oxide semiconductor layer 120 includes indium gallium zinc oxide (IGZO) or/and indium tin zinc oxide (ITZO). As another example, the oxide semiconductor layer 120 includes at least one of $SnO_2$, $In_2O_3$, ZnO, CdO, $Cd_2SnO_4$, $TiO_2$, etc.

Figure 5:
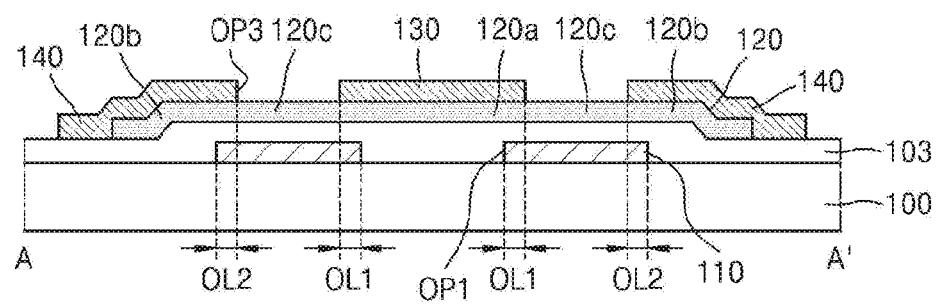
Figure 6:
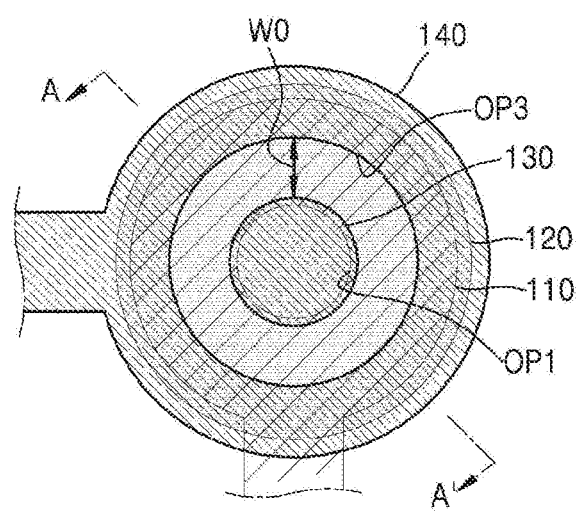

Referring to FIGS. 5 and 6, the inner electrode 130 and an outer electrode 140 are formed on the oxide semiconductor layer 120. The inner electrode 130 may be located on a center region of the oxide semiconductor layer 120. The outer electrode 140 may be located on an outer region of the oxide semiconductor layer 120.

The inner electrode 130 and the outer electrode 140 may be formed on the oxide semiconductor layer 120 and may be electrically connected to the oxide semiconductor layer 120. The inner electrode 130 may be in an island shape and may be electrically connected to the center region of the oxide semiconductor layer 120. The outer electrode 140 may be electrically connected to the outer region of the oxide semiconductor layer 120. The inner electrode 130 may be a source electrode. The outer electrode 140 may be a drain electrode. In this case, the center region of the oxide semiconductor layer 120 may correspond to the source area, and the outer region thereof may correspond to the drain area.

Hereinafter, the center region of the oxide semiconductor layer 120, in which the inner electrode 130 is formed, is referred to as a first area 120a, the outer region of the oxide semiconductor layer 120, in which the outer electrode 140 is formed, is referred to as a second area 120b, and an area of the oxide semiconductor layer 120 exposed between the inner electrode 130 and the outer electrode 140, i.e. an intermediate region between the first area 10a and the second area 120b is referred to as a third area 120c.

The outer electrode 140 may include a third opening OP3 therein. The inner electrode 130 may be disposed in the third opening OP3. The size of the inner electrode 130 may be less than that of the third opening OP3. For example, the diameter of the inner electrode 130 is less than that of the third opening OP3 so that the inner electrode 130 may be surrounded by the outer electrode 140 while being spaced apart from the outer electrode 140 by a predetermined distance W0. The spaced distance W0 between the outer electrode 140 and the inner electrode 130, i.e. a distance between an inner end portion of the outer electrode 140 and an outer end portion of the inner electrode 130, may correspond to a width of the third area 120c of the oxide semiconductor layer 120.

The inner electrode 130 and the outer electrode 140 may include the same material on the same layer. For example, the inner electrode 130 and the outer electrode 140 are formed by forming and patterning a metal layer (not shown) on the oxide semiconductor layer 120. The inner electrode 130 and the outer electrode 140 may be formed to have a single or multi-layer structure by using one or more materials among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or an alloy thereof, by taking into account conductivity, etc.

The size of the inner electrode 130 may be greater than that of the first opening OP1 of the lower gate electrode 110. For example, a diameter of the inner electrode 130 is greater than that of the first opening OP1 so that the inner electrode 130 partially overlaps the lower gate electrode 110. In some exemplary embodiments, an outer end portion of the inner electrode 130 partially overlaps an inner end portion of the lower gate electrode 110 adjacent to the first opening OP1. OL1 of FIG. 5 denotes an area of the inner electrode 130 that partially overlaps the lower gate electrode 110.

The size of the third opening OP3 formed in the outer electrode 140 may be smaller than that of the lower gate electrode 110. For example, the diameter of the third opening OP3 is less than the diameter of the outer end portion of the lower gate electrode 110 so that the outer electrode 140 partially overlaps the lower gate electrode 110. For example, an inner end portion of the outer electrode 140 partially overlaps the outer end portion of the lower gate electrode 110. OL2 of FIG. 5 denotes an area of the outer electrode 140 that partially overlaps the lower gate electrode 110.

When the third area 120c of the oxide semiconductor layer 120 and the lower gate electrode 110 corresponding to the spaced distance W0 between the outer electrode 140 and the inner electrode 130 have the same shape and area, the electrodes 110, 130, and 140 may be misaligned, and a channel characteristic formed in the third area 120c of the oxide semiconductor layer 120 may deteriorate. However, in the exemplary embodiments, since the outer electrode 140 and the inner electrode 130 are formed to partially overlap the lower gate electrode 110, such problems may be prevented.

Figure 7:
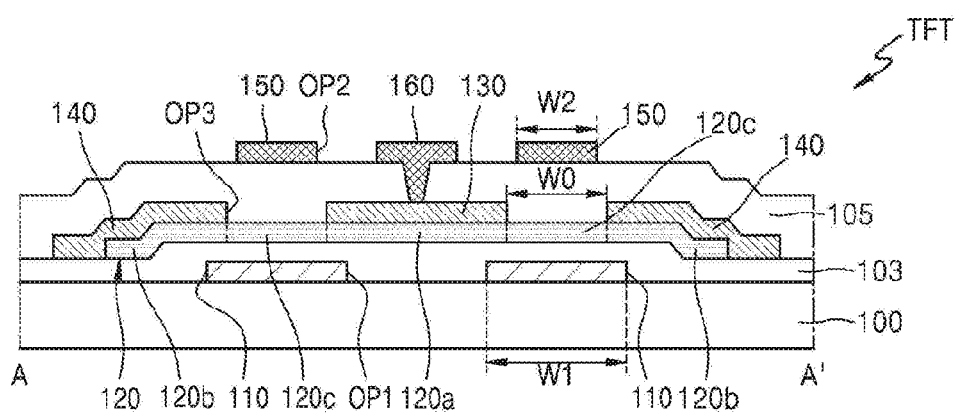
Figure 8:
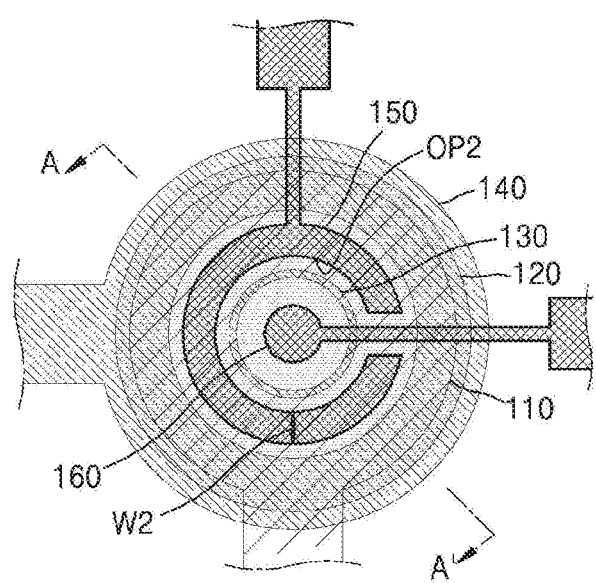

Referring to FIGS. 7 and 8, an upper gate electrode 150 and a connection wiring 160 are formed after forming a second insulating layer 105.

The second insulating layer 105 may be formed to completely cover the substrate 100 and may be formed of an insulating inorganic material such as silicon oxide and silicon nitride or an insulating organic material.

The upper gate electrode 150 and the connection wiring 160 may be formed by forming a metal layer (not shown) on the second insulating layer 105 and patterning the metal layer. The upper gate electrode 150 may be formed to have a single or multi-layer structure by using one or more materials among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or an alloy thereof, by taking into account an adhesive force with respect to an adjacent layer, a degree of surface planarization of a layer to be stacked, and processability.

The upper gate electrode 150 may be disposed to face the lower gate electrode 110 with the third area 120c of the oxide semiconductor layer 120 disposed between the upper gate electrode 150 and the lower gate electrode 110. When light of a visible light band is received in the oxide semiconductor layer 120, a threshold voltage of a thin film transistor or a drain current may unexpectedly increase due to electrons excited by photons. However, according to the exemplary embodiments, the upper and lower gate electrodes 110 and 150 may be used to form a strong field and respectively cover the oxide semiconductor layer 120 above and below, and thus light may be blocked from being received in the oxide semiconductor layer 120, thereby preventing the threshold voltage or/and the drain current from increasing due to the light.

The upper gate electrode 150 may include a second opening OP2 in a center region thereof. The inner electrode 130 and the second opening OP2 of the upper gate electrode 150 may be formed to partially overlap each other on the same axial line, thereby preventing generation of parasitic capacitance between the inner electrode 130 and the upper gate electrode 150.

The upper gate electrode 150 may have a second width W2 from an inner end portion adjacent to the second opening OP2 to an outer end portion thereof. The second width W2 of the upper gate electrode 150 may be less than a width of the third area 120c of the oxide semiconductor layer 120, i.e. the spaced distance W0 between the outer electrode 140 and the inner electrode 130. Thus, in the plan view of the thin film transistor shown in FIG. 8, the upper gate electrode 150 may be spaced apart from the outer electrode 140 and the inner electrode 130 by a predetermined distance between the outer electrode 140 and the inner electrode 130. For example, an inner end portion of the upper gate electrode 150 is spaced apart from an outer end portion of the inner electrode 130 in a direction toward the outer electrode 140 from the inner electrode 130, and an outer end portion of the upper gate electrode 150 is spaced apart from an inner end portion of the outer electrode 140 in a direction toward the inner electrode 130 from the outer electrode 140.

If the second width W2 of the upper gate electrode 150 is the same as the first width W1 of the lower gate electrode 110, the upper gate electrode 150 and the inner electrode 130 may partially overlap each other, and thus parasitic capacitance may be generated therebetween, Also, the upper gate electrode 150 and the outer electrode 140 may partially overlap each other, and thus parasitic capacitance may be generated therebetween. However, according to some exemplary embodiments, as described above, the first width W1 of the lower gate electrode 110 is greater than the spaced distance W0 between the outer electrode 140 and the inner electrode 130, and the second width W2 of the upper gate electrode 150 is less than the spaced distance W0 between the outer electrode 140 and the inner electrode 130, thereby preventing deterioration of a channel characteristic due to misalignment and simultaneously minimizing an influence caused by parasitic capacitance. Thus, a kickback voltage and a leakage current may be reduced.

The upper gate electrode 150 and the lower gate electrode 110 may receive the same signal and may have the same voltage level. Since the same signal is applied to the lower gate electrode 110 and the upper gate electrode 150, a channel may be formed in the third area 120c of the oxide semiconductor layer 120.

The connection wiring 160 may be electrically connected to the inner electrode 130 through a contact hole formed in the second insulating layer 105. A signal may be applied to the inner electrode 130 patterned in an island shape through the connection wiring 160. The connection wiring 160 may be formed of the same material as the upper gate electrode 150 on the same layer as the upper gate electrode 150. In this case, the upper gate electrode 150 may have a partially open C shape, as shown in FIG. 8, such that the connection wiring 160 may extend in one direction and may be connected to another device or wiring.

The connection wiring 160 may include the same material as the upper gate electrode 150 on the same layer as the upper gate electrode 150 in the present exemplary embodiment but is not limited thereto. As another exemplary embodiment, the connection wiring 160 may be formed on the upper gate electrode 150 with an insulating layer disposed between the connection wiring 160 and the upper gate electrode 150. In this case, unlike FIG. 8, the upper gate electrode 150 may have a ring shape.

A function of the thin film transistor according to exemplary embodiments will now be described in more detail with reference to FIG. 9 below.

Figure 9:
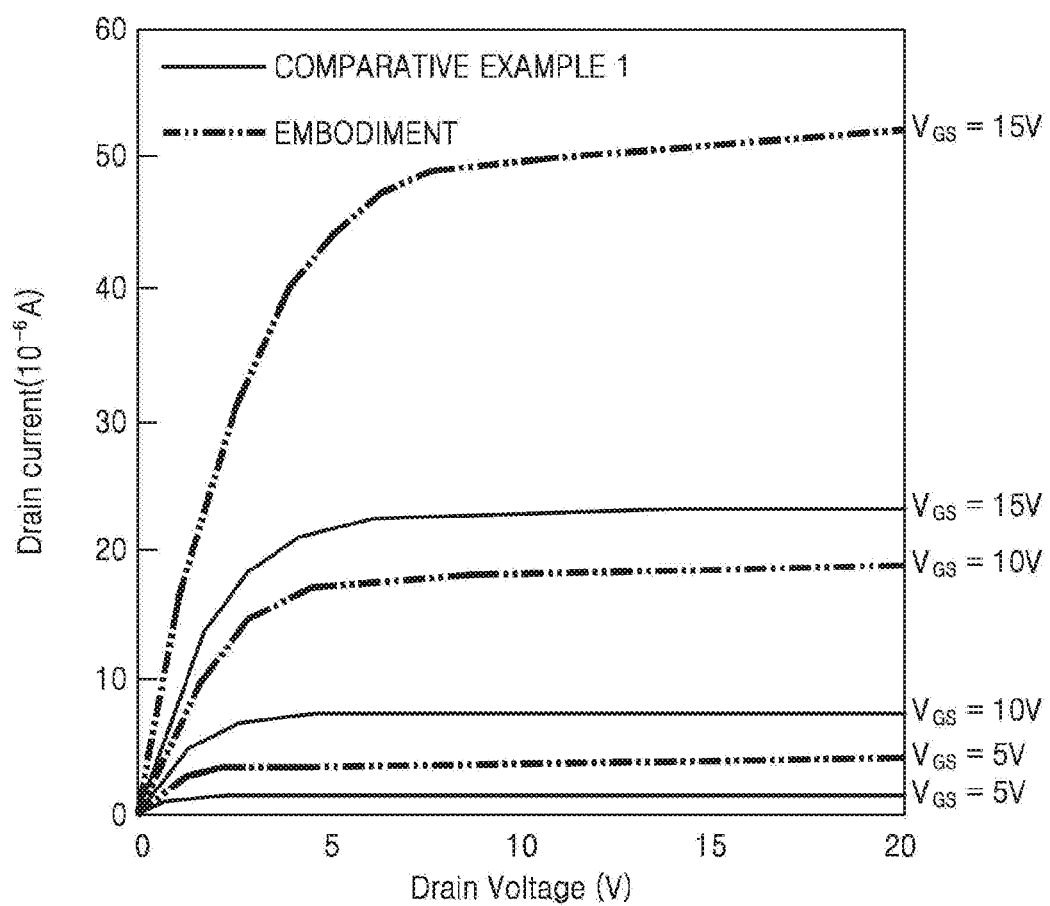
FIG. 9 is a graph showing characteristics of thin film transistors according to an exemplary embodiment and a comparative example 1.
Figure 10:
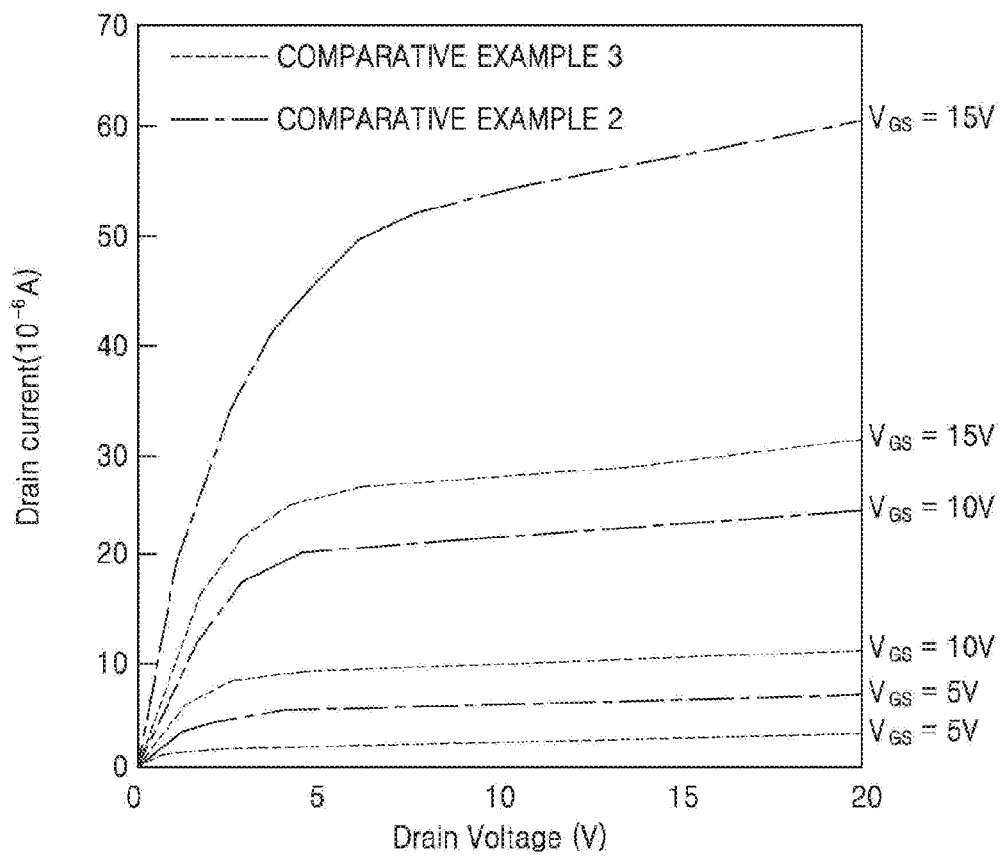
FIG. 10 is a graph showing characteristics of thin film transistors according to comparative examples 2 and 3.
Figure 11:
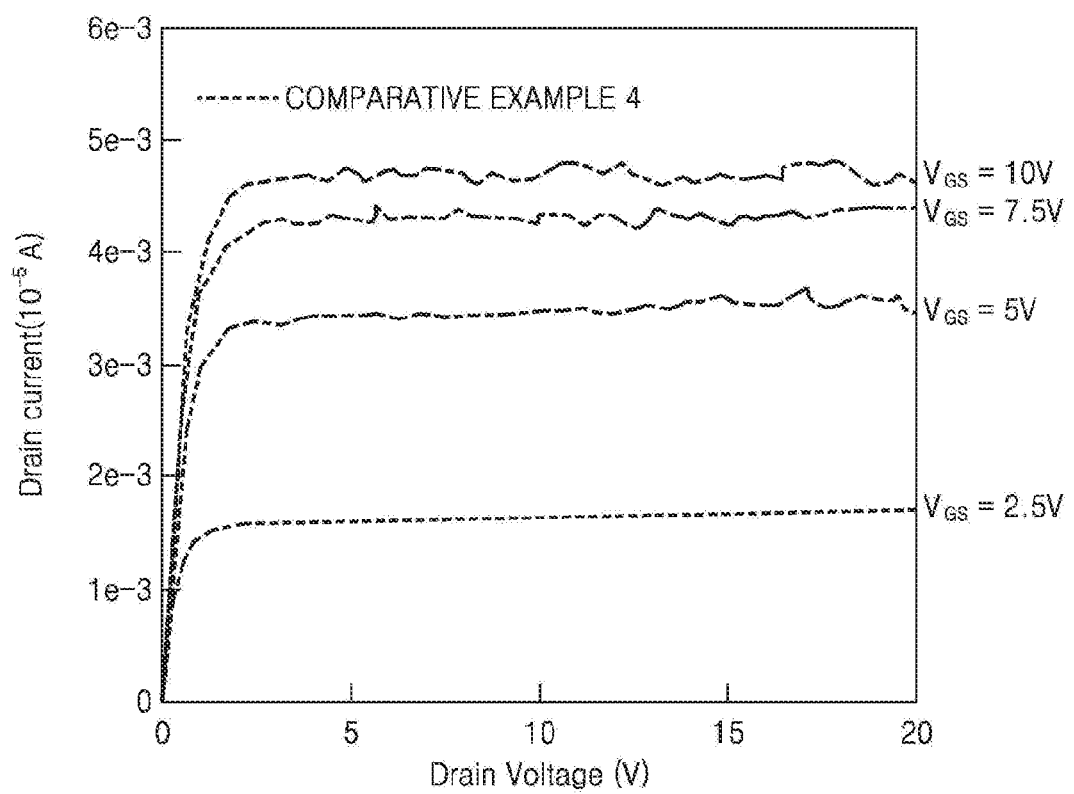
FIG. 11 is a graph showing a characteristic of a thin film transistor according to a comparative example 4.
Figure 12:
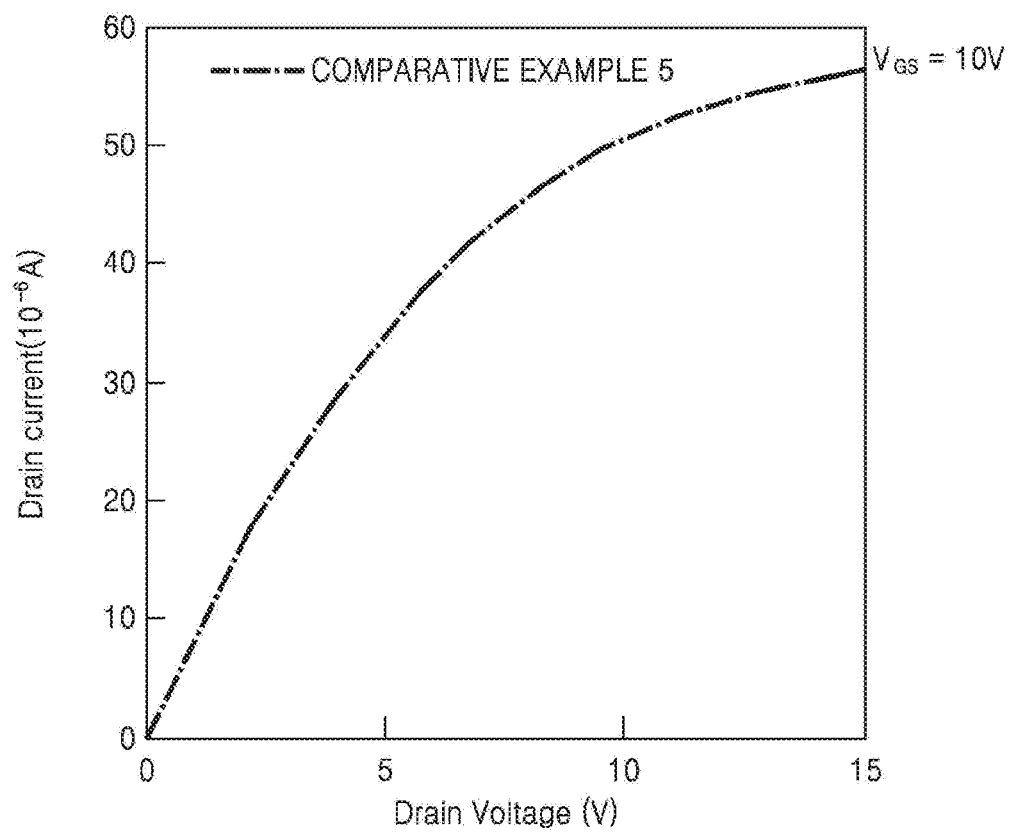
FIG. 12 is a graph showing a characteristic of a thin film transistor according to a comparative example 5.

FIG. 9 is a graph showing characteristics of thin film transistors according to an exemplary embodiment and a comparative example 1. FIG. 10 is a graph showing characteristics of thin film transistors according to comparative examples 2 and 3. FIG. 11 is a graph showing a characteristic of a thin film transistor according to a comparative example 4. FIG. 12 is a graph showing a characteristic of a thin film transistor according to a comparative example 5.

In FIG. 9, a thin film transistor of the Embodiment has a structure described with reference to FIGS. 1 through 8. A thin film transistor of the Comparative example 1 includes only the lower gate electrode 110 among the upper and lower gate electrodes 110 and 150 included in the thin film transistor of the exemplary embodiment. In the thin film transistors of the Embodiment and the Comparative example 1, the inner electrode 130 is a source electrode, and the outer electrode 140 is a drain electrode.

In FIG. 10, a thin film transistor of the Comparative example 2 has the same structure as described in the exemplary embodiment, however, the inner electrode 130 of the Comparative example 2 is a drain electrode, and the outer electrode 140 of the Comparative example 2 is a source electrode. A thin film transistor of the Comparative example 3 includes only the lower gate electrode 110 among the upper and lower gate electrodes 110 and 150 included in the thin film transistor of the Comparative example 2.

In FIG. 11, a thin film transistor of the Comparative example 4 includes only the upper gate electrode 150 among the upper and lower gate electrodes 110 and 150 included in the thin film transistor of the exemplary embodiment. A thin film transistor includes of the Comparative example 5 includes a bar type oxide semiconductor layer and a source electrode and a drain electrode at both end portions of the bar type oxide semiconductor layer, and includes upper and lower gate electrodes disposed to face each other with the oxide semiconductor layer disposed between the upper and lower gate electrodes.

In FIGS. 9 through 12, $V_{GS}$ denotes upper and lower gate electrodes (Embodiment, and Comparative examples 2 and 5), the lower gate electrode (Comparative examples 1 and 3), or the upper gate electrode (Comparative example 4).

Referring to FIG. 9, with regard to the thin film transistor of the Embodiment, a drain current has a substantially uniform value in an area when at least the threshold voltage is applied. Such a characteristic may be used to inhibit a brightness difference for each pixel due to a voltage drop in a large size OLED display as will be described later with reference to FIG. 16.

With regard to the thin film transistor of the Comparative example 1, a drain current is maintained to be substantially uniform in an area when at least the threshold voltage is applied, similar to the thin film transistor of the exemplary embodiment. However, an increase rate of the drain current with respect to an increase in a gate voltage is reduced more than about 2 times by the thin film transistor of the exemplary embodiment. For example, in the thin film transistor of the Embodiment, unlike the Comparative example 1, the increase rate of the drain current with respect to the increase of the gate voltage is relatively greater than that of the Comparative example 1, which shows that the drain current is slightly adjusted by the gate voltage and/or an operation characteristic is excellent even though the thin film transistor is small. Such characteristics may be used to represent abundant and diverse grayscales in the OLED display as will be described later with reference to FIG. 16 and implement high resolution.

Referring to FIGS. 10 and 12, in the thin film transistors of the Comparative examples 2, 3, and 5, a drain current changes according to a change in a drain voltage in an area after a threshold voltage, and thus it is difficult to compensate for a voltage drop in a large display apparatus, unlike the thin film transistor of the Embodiment.

Referring to FIG. 11, in the thin film transistor of the Comparative example 4, since a drain current is very small such as about several $10^{-8}$ A or so, it is impossible to actually drive the thin film transistor.

An OLED display including a thin film transistor according to an exemplary embodiment will now be described below.

Figure 13:
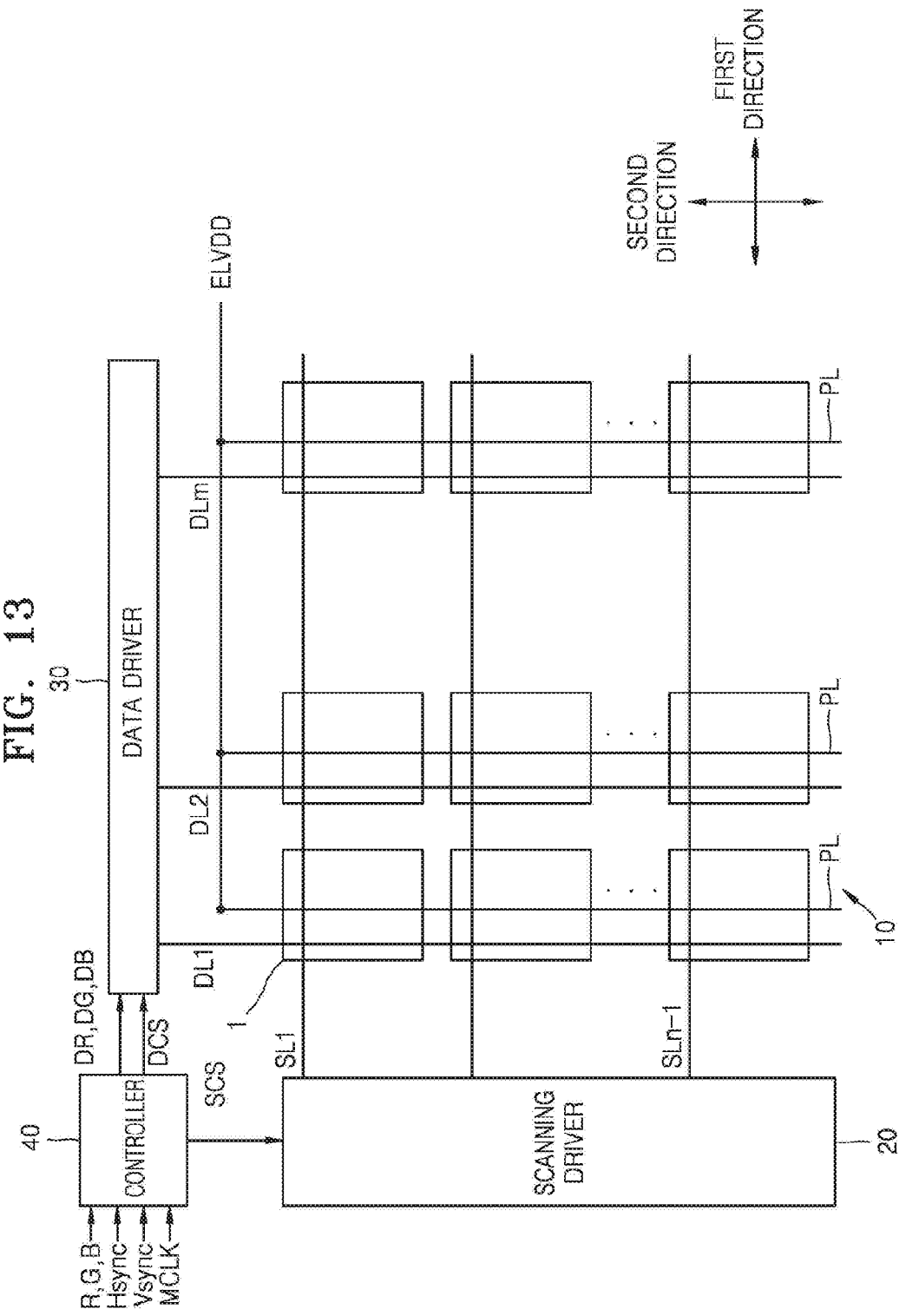
FIG. 13 is a block diagram schematically showing an OLED display according to an exemplary embodiment.

FIG. 13 is a block diagram schematically showing an OLED display according to an exemplary embodiment.

Referring to FIG. 13, the OLED display includes a display unit 10 including a plurality of pixels 1, a scanning driver 20, a data driver 30, and a controller 40.

The display unit 10 may include the pixels 1 arranged at intersections of a plurality of scanning lines SL1 through SLn and a plurality of data lines DL1 through DLm. The scanning lines SL1 through SLn may extend in a first direction. The data lines DL1 through DLm may extend in a second direction. Each of the pixels 1 is connected to one of the scanning lines SL1 through SLn in FIG. 12 but is not limited thereto. In some exemplary embodiments, each of the pixels 1 is connected to two or more of the scanning lines SL1 through SLn according to the number and functions of transistors included in the pixels 1.

The scanning driver 20 may generate and transmit a scanning signal to each pixel 1 through each of the scanning lines SL1 through SLn. The data driver 30 may transmit a data signal to each pixel 1 through the data lines DL1 through DLm. The controller 40 may change a plurality of image signals R, G, and B received from an external source to a plurality of image data signals DR, DG, and DB, and transmit the image data signals DR, DG, and DB to the data driver 30. The controller 40 may generate control signals for controlling driving of the scanning driver 20 and the data driver 30 upon receiving a vertical synchronization signal Vsync, a horizontal synchronization signal Hsync, and a clock signal MCLK, and transmit the control signals to each of the scanning driver 20 and the data driver 30. The controller 40 may generate and transmit a scanning driving control signal SCS for controlling the scanning driver 20 and a data driving control signal DCS for controlling the data driver 30.

Each pixel 1 may receive a first power voltage ELVDD and a second power voltage ELVSS (see FIG. 13) from an external source. The first power voltage ELVDD may be a predetermined high level voltage. The second power voltage ELVSS may be a voltage lower than the first power voltage ELVDD or a ground voltage.

Figure 14:
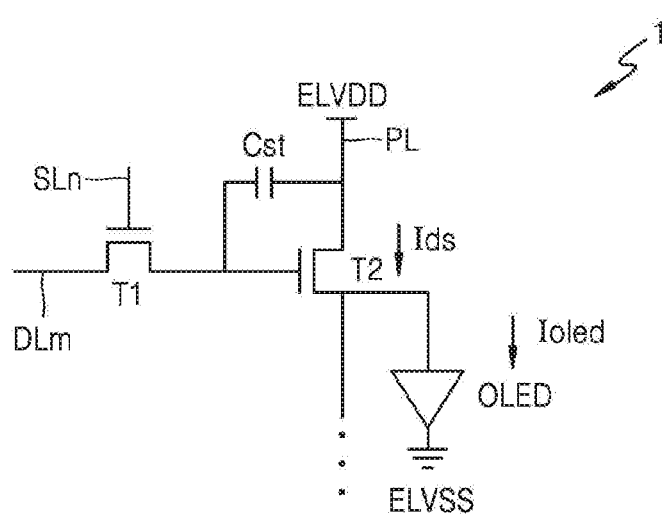
FIG. 14 is an equivalent circuit diagram of one pixel of the OLED display of FIG. 13.
Figure 15:
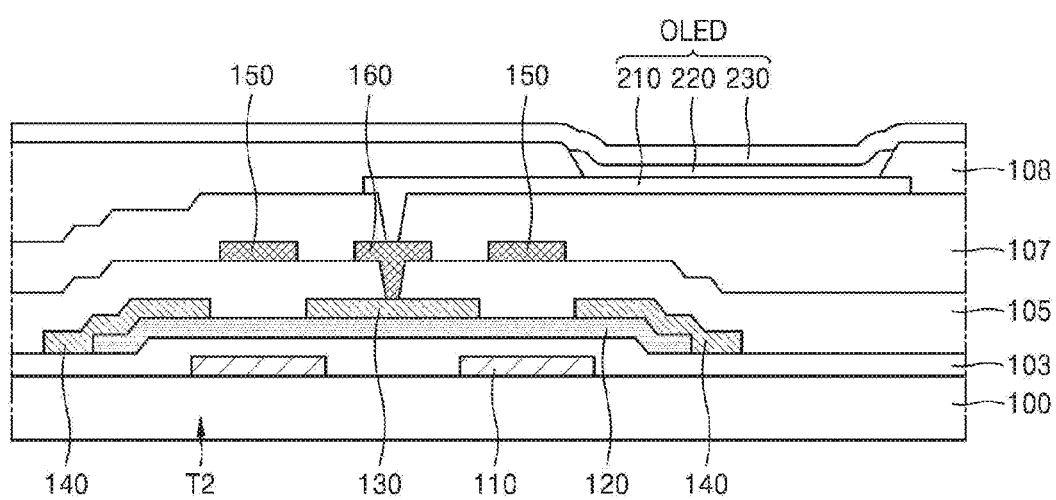
FIG. 15 is a cross-sectional view of a driving thin film transistor and an OLED of the OLED display of FIG. 14.
Figure 16:
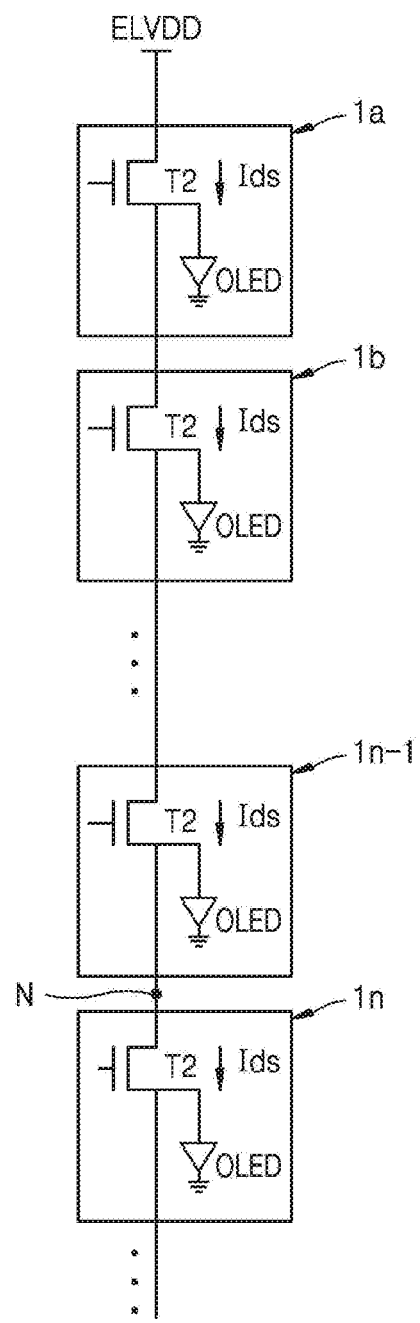
FIG. 16 is a diagram of a plurality of pixels that are included in one column of FIG. 13.

FIG. 14 is an equivalent circuit diagram of one pixel 1 of the OLED display of FIG. 13. FIG. 15 is a cross-sectional view of a driving thin film transistor T2 and an OLED of the OLED display of FIG. 14. FIG. 16 is a diagram of a plurality of pixels that are included in one column of FIG. 13. The equivalent circuit diagram of FIG. 14 is merely an example but the exemplary embodiments are not limited thereto.

Referring to FIG. 14, each pixel 1 includes at least one switching thin film transistor T1, the driving thin film transistor T2, a storage capacitor Cst and the OLED that emits light of a predetermined brightness by a driving current bled.

A gate electrode of the switching thin film transistor T1 may be connected to the scanning line SLn. One of a source electrode and a drain electrode may be connected to the data line DLm, and the other one may be connected to one end of the storage capacitor Cst. The switching thin film transistor T1 may be turned on when a scanning signal is provided from the scanning line SLn and then provide the storage capacitor Cst with a data signal provided from the data line DLm. In this regard, the storage capacitor Cst may be charged with a voltage corresponding to the data signal.

Referring to FIGS. 14 and 15, the driving thin film transistor T2 has the same structure as that of the thin film transistors TFT described with reference to FIGS. 1 through 8 above. The lower gate electrode 110 and the upper gate electrode 150 of the driving thin film transistor T2 may be electrically connected to the switching thin film transistor T1. The outer electrode 140 that is a drain electrode may be electrically connected to one end of the storage capacitor Cst and a driving voltage line PL. The inner electrode 130 that is a source electrode may be connected to a pixel electrode 210 of the OLED. The inner electrode 130 of the driving thin film transistor T2 may be pixel electrode 210 of the OLED with a third insulating layer 107 disposed between the inner electrode 130 and the pixel electrode 210. An emissive layer 220 of the OLED may be disposed between the pixel electrode 210 and a counter electrode 230 and formed on a pixel defining layer 108 that exposes the pixel electrode 210.

The driving thin film transistor T2 may be turned on by the switching thin film transistor T1 and may control the driving current Ioled that flows from the driving voltage line PL to the counter electrode 230 in correspondence with a voltage value stored in the storage capacitor Cst. The emissive layer 220 of the OLED may emit light having a predetermined brightness by the driving current Ioled.

The first power voltage ELVDD may be applied to a plurality of pixels 1a, 1b, . . . , 1n-1, and 1n through the driving voltage line PL as shown in FIG. 16. Although the first power voltage ELVDD applied to the pixels 1a, 1b, . . . , 1n-1, and 1n needs to be the same ideally, since a voltage drop occurs due to resistance by a length of the driving voltage line PL and/or resistance of a circuit included in each of the pixels 1a, 1b, . . . , 1n-1, and 1n actually, a voltage applied to each of the pixels 1a, 1b, . . . , 1n-1, and 1n through the driving voltage line PL may be gradually reduced. When such a voltage drop occurs, since the driving current Ioled that flows in the OLED is changed for each of the pixels 1a, 1b, . . . , 1n-1, and 1n, a brightness deviation may occur for each of the pixels 1a, 1b, . . . , 1n-1, and 1n. For example, a voltage supplied to the driving thin film transistor T2 of the nth pixel 1n through the driving voltage line PL, i.e. a voltage in an N point, may be different from a voltage supplied to the first pixel 1a by resistance of the driving voltage line PL and a voltage drop caused by the first pixel 1a through an n-1th pixel 1n-1.

However, according to the exemplary embodiments, the driving thin film transistor T2 is a thin film transistor described with reference to FIGS. 1 through 8, and thus the driving current Ioled (see FIG. 13) that flows in the OLED of each of the pixels 1a, 1b, . . . , 1n-1, and 1nh may have substantially the same value.

For example, referring to FIGS. 9, 14, and 15, when the gate voltage $V_{GS}$ of the driving thin film transistor T2 is about 10V and a voltage (drain voltage) supplied to the first pixel 1a is about 15V, a drain current Ids of the driving thin film transistor T2 and the driving current Ioled of the OLED are about 18 µA. Although a voltage (drain voltage) applied to the driving thin film transistor T2 of the nth pixel In by the voltage drop drops to about 10 V, since the driving thin film transistor T2 has the characteristic as shown in FIG. 9, the drain current Ids of the driving thin film transistor T2 of the nth pixel In and the driving current Ioled of the OLED of the first pixel 1a may be the same such as about 18 µA. Thus, although the voltage drop occurs in the OLED display, an influence on each of the pixels 1a, 1b, . . . , 1n-1 may be minimized or removed.

In the driving thin film transistor T2 of each of the pixels 1a, 1b, . . . , 1n-1, as described with reference to FIG. 9 above, an increase rate of a drain current with respect to an increase of a gate voltage is relatively great, thereby representing abundant and diverse grayscales using the gate voltage applied to the driving thin film transistor T2.

A case where the voltage drop occurs is described with reference to FIG. 16 but the exemplary embodiments are not limited thereto. For example, the thin film transistor according to the exemplary embodiments maintains a substantially uniform current (drain current) not only when the voltage drop occurs as shown in FIG. 9, but also when a voltage rise occurs.

A thin film transistor substrate shown in FIGS. 1 through 8 means in the above-described exemplary embodiments that the upper gate electrode 150 is formed but the exemplary embodiments are not limited thereto. In the present specification, the thin film transistor substrate means a state where a thin film transistor is formed on the substrate 100. As shown in FIG. 7, the thin film transistor substrate may mean a state where a thin film transistor TFT is formed on the substrate 100. Alternatively, as shown in FIG. 15, the thin film transistor substrate may mean a state where the third insulating layer 107 is formed over the thin film transistor (e.g. the driving thin film transistor T2). Alternatively, as shown in FIG. 15, the thin film transistor substrate may mean a state where the pixel electrode 210 is formed over the thin film transistor (e.g. the driving thin film transistor T2).

According to the exemplary embodiments, a film transistor may remove the influence due to a voltage drop or a voltage increase, may be small in size, and may have excellent electrical characteristics, and thus a display quality of a high resolution and wide area display apparatus may be enhanced.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A thin film transistor (TFT) substrate, comprising:
a substrate; and
a TFT located on the substrate and comprising:
 a lower gate electrode;
 a first insulating layer covering the lower gate electrode;
 an oxide semiconductor layer located on the first insulating layer;
 a first electrode located on the oxide semiconductor layer and having an island shape;
 a second electrode located on the oxide semiconductor layer and surrounding the first electrode;
 a second insulating layer at least partially covering the oxide semiconductor layer; and
 an upper gate electrode located on the second insulating layer,
wherein the oxide semiconductor layer includes a first region, a second region surrounding the first region, and a third region interposed between the first and second regions,
wherein the first electrode is located in the first region of the oxide semiconductor layer,
wherein the second electrode is located in the second region of the oxide semiconductor layer,
wherein the lower and upper gate electrodes face each other, and wherein the third region of the oxide semiconductor layer is interposed between the lower and upper gate electrodes,
wherein the lower gate electrode has a first opening corresponding to the first electrode,
wherein the upper gate electrode has a second opening corresponding to the first opening, and
wherein the second opening of the upper gate electrode is larger than the first electrode.

2. The TFT substrate of claim 1, wherein the first electrode includes a source electrode, and wherein the second electrode includes a drain electrode.

3. The TFT substrate of claim 1, wherein the first electrode is larger than the first opening and smaller than the second opening.

4. The TFT substrate of claim 1, wherein the lower gate electrode has a first width defined from an inner end portion, adjacent to the first opening, to an outer end portion of the lower gate electrode, and
wherein the upper gate electrode has a second width defined from an inner end portion, adjacent to the second opening, to an outer end portion of the upper gate electrode.

5. The TFT substrate of claim 4, wherein the first width is greater than the second width.

6. The TFT substrate of claim 4, wherein the first width is greater than a width of the third region of the oxide semiconductor layer, and
wherein at least one of the inner and outer end portions of the lower gate electrode partially overlaps the first electrode or the second electrode.

7. The TFT substrate of claim 1, wherein the first and second electrodes are located on the same layer.

8. The TFT substrate of claim 1, wherein the lower and upper gate electrodes are configured to have the same voltage level.

9. The TFT substrate of claim 1, further comprising a connection wiring located on the second insulating layer and electrically connected to the first electrode.

10. A thin film transistor (TFT) substrate, comprising:
a substrate; and
a TFT located on the substrate and comprising:
 a lower gate electrode;
 a first insulating layer covering the lower gate electrode;
 an oxide semiconductor layer located on the first insulating layer;
 a first electrode located on the oxide semiconductor layer and having an island shape;
 a second electrode located on the oxide semiconductor layer and surrounding the first electrode;
 a second insulating layer at least partially covering the oxide semiconductor layer; and
 an upper gate electrode located on the second insulating layer,
wherein the oxide semiconductor layer includes a first region, a second region surrounding the first region, and a third region interposed between the first and second regions,
wherein the first electrode is located in the first region of the oxide semiconductor layer,
wherein the second electrode is located in the second region of the oxide semiconductor layer,
wherein the lower and upper gate electrodes face each other, and wherein the third region of the oxide semiconductor layer is interposed between the lower and upper gate electrodes,
wherein the lower gate electrode has a first opening corresponding to the first electrode, wherein the upper gate electrode has a second opening corresponding to the first opening,
wherein the lower gate electrode has a first width defined from an inner end portion, adjacent to the first opening, to an outer end portion of the lower gate electrode, wherein the upper gate electrode has a second width defined from an inner end portion, adjacent to the second opening, to an outer end portion of the upper gate electrode, wherein the second width is less than a width of the third region of the oxide semiconductor layer, wherein the inner end portion of the upper gate electrode is spaced apart from the outer end portion of the first electrode in a direction extending from the first electrode toward the second electrode, and wherein the outer end portion of the upper gate electrode is spaced apart from the inner end portion of the second electrode in a direction extending from the second electrode toward the first electrode.

11. An organic light-emitting diode (OLED) display, comprising:

a plurality of pixels disposed on a substrate, each of the pixels comprising:

a switching thin film transistor (TFT) located on the substrate;

a driving TFT located on the substrate and electrically connected to the switching TFT;

a pixel electrode electrically connected to the driving TFT;

an emissive layer located on the pixel electrode; and a counter electrode facing the pixel electrode with the emissive layer interposed between the counter electrode and the pixel electrode, wherein the driving TFT comprises:

an oxide semiconductor layer;

a first electrode located on a first region of the oxide semiconductor layer and having an island shape;

a second electrode located on an second region of the oxide semiconductor layer, wherein the second region is spaced apart from the first region and surrounds the first region; and lower and upper gate electrodes facing each other with the oxide semiconductor layer disposed between the lower and upper gate electrodes, wherein the lower gate electrode has a first opening corresponding to the first electrode, wherein the upper gate electrode has a second opening corresponding to the first opening, and wherein an inner end portion of the lower gate electrode adjacent to the first opening partially overlaps the first electrode.

12. The OLED display of claim 11, wherein the first electrode includes a source electrode, and wherein the second electrode includes a drain electrode.

13. The OLED display of claim 11, wherein the first opening, the second opening, and the first electrode are disposed on the same axial line.

14. The OLED display of claim 11, wherein the second opening of the upper gate electrode is larger than the first electrode.

15. The OLED display of claim 11, wherein the first and second electrodes are located on the same layer.

16. The OLED display of claim 11, wherein the lower and upper gate electrodes are configured to have the same voltage level.

17. The OLED display of claim 11, wherein the upper and lower gate electrodes of the driving TFT are configured to control a grayscale of a selected pixel including the driving TFT.

* * * * *